(12) United States Patent
Ozawa et al.

(10) Patent No.: US 9,666,506 B2
(45) Date of Patent: May 30, 2017

(54) HEAT SPREADER WITH WIRING SUBSTRATE FOR REDUCED THICKNESS

(71) Applicant: Shinko Electric Industries Co., Ltd., Nagano-shi, Nagano-ken (JP)

(72) Inventors: Takashi Ozawa, Nagano (JP); Kazuki Tokunaga, Nagano (JP)

(73) Assignee: Shinko Electric Industries Co., Ltd., Nagano-shi, Nagano-ken (JP)

( * ) Notice: Subject to any disclaimer, the term of this patent is extended or adjusted under 35 U.S.C. 154(b) by 0 days.

(21) Appl. No.: 14/886,312

(22) Filed: Oct. 19, 2015

(65) Prior Publication Data

US 2016/0133541 A1    May 12, 2016

(30) Foreign Application Priority Data

Nov. 7, 2014    (JP) .................................. 2014-227144

(51) Int. Cl.
*H01L 23/552* (2006.01)
*H01L 23/00* (2006.01)
(Continued)

(52) U.S. Cl.
CPC ........ *H01L 23/4334* (2013.01); *H01L 23/552* (2013.01); *H01L 24/97* (2013.01); *H01L 21/561* (2013.01); *H01L 23/49816* (2013.01); *H01L 24/13* (2013.01); *H01L 24/16* (2013.01); *H01L 24/29* (2013.01); *H01L 24/32* (2013.01); *H01L 24/73* (2013.01); *H01L 24/83* (2013.01); *H01L 24/92* (2013.01); *H01L 25/0655* (2013.01); *H01L 2224/13111* (2013.01); *H01L 2224/13116* (2013.01); *H01L 2224/13144* (2013.01);
(Continued)

(58) Field of Classification Search
CPC . H01L 23/367; H01L 23/4334; H01L 23/528; H01L 23/5328; H01L 23/552; H01L 24/97

See application file for complete search history.

(56) References Cited

U.S. PATENT DOCUMENTS 6,249,433 B1 * 6/2001 Huang ................ H01L 23/4334
165/185
6,891,732 B2 * 5/2005 Takano ................... H01L 23/10
257/707

(Continued)

FOREIGN PATENT DOCUMENTS

JP    2009302556    12/2009

*Primary Examiner* — John C Ingham
*Assistant Examiner* — Gustavo Ramallo
(74) *Attorney, Agent, or Firm* — Fish & Richardson P.C.

(57) ABSTRACT

A semiconductor device includes a wiring substrate, a semiconductor element mounted on the wiring substrate, a heat dissipation plate arranged on an upper surface of the semiconductor element with an adhesive arranged in between, and an encapsulation resin filling a gap between the heat dissipation plate and the wiring substrate. The heat dissipation plate includes a body and a projection. The body is overlapped with the semiconductor element in a plan view and has a larger planar shape than the semiconductor element. The projection is formed integrally with the body. The projection projects outward from an end of the body and is located below the body. The encapsulation resin covers upper and lower surfaces of the projection. The body includes an upper surface exposed from the encapsulation resin.

6 Claims, 8 Drawing Sheets

(51) Int. Cl.
*H01L 23/433* (2006.01)
*H01L 21/56* (2006.01)
*H01L 25/065* (2006.01)
*H01L 23/498* (2006.01)

(52) U.S. Cl.
CPC ............ *H01L 2224/16227* (2013.01); *H01L 2224/293* (2013.01); *H01L 2224/2919* (2013.01); *H01L 2224/2929* (2013.01); *H01L 2224/29109* (2013.01); *H01L 2224/29191* (2013.01); *H01L 2224/29291* (2013.01); *H01L 2224/32225* (2013.01); *H01L 2224/32245* (2013.01); *H01L 2224/73204* (2013.01); *H01L 2224/73253* (2013.01); *H01L 2224/83191* (2013.01); *H01L 2224/92125* (2013.01); *H01L 2224/92225* (2013.01); *H01L 2224/97* (2013.01); *H01L 2924/10253* (2013.01); *H01L 2924/14* (2013.01); *H01L 2924/1431* (2013.01); *H01L 2924/1432* (2013.01); *H01L 2924/1434* (2013.01); *H01L 2924/1436* (2013.01); *H01L 2924/1438* (2013.01); *H01L 2924/15311* (2013.01); *H01L 2924/15312* (2013.01); *H01L 2924/15313* (2013.01)

(56) References Cited

U.S. PATENT DOCUMENTS

| 2001/0009302 | A1* | 7/2001 | Murayama | H01L 23/3733 257/704 |
| 2005/0077615 | A1* | 4/2005 | Yu | H01L 23/367 257/706 |
| 2005/0167849 | A1* | 8/2005 | Sato | H01L 23/4334 257/778 |
| 2006/0268524 | A1* | 11/2006 | Uehara | G11O 5/04 361/715 |

* cited by examiner

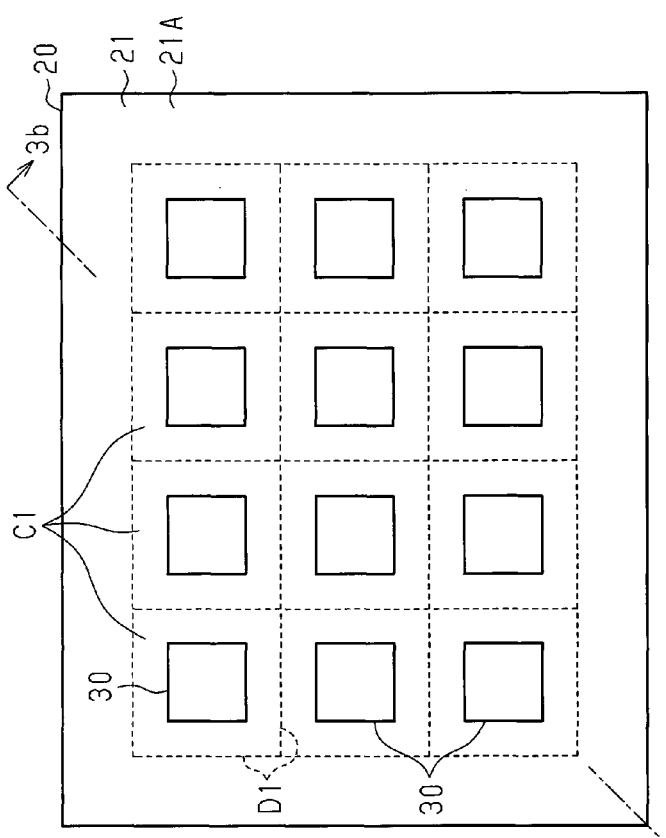
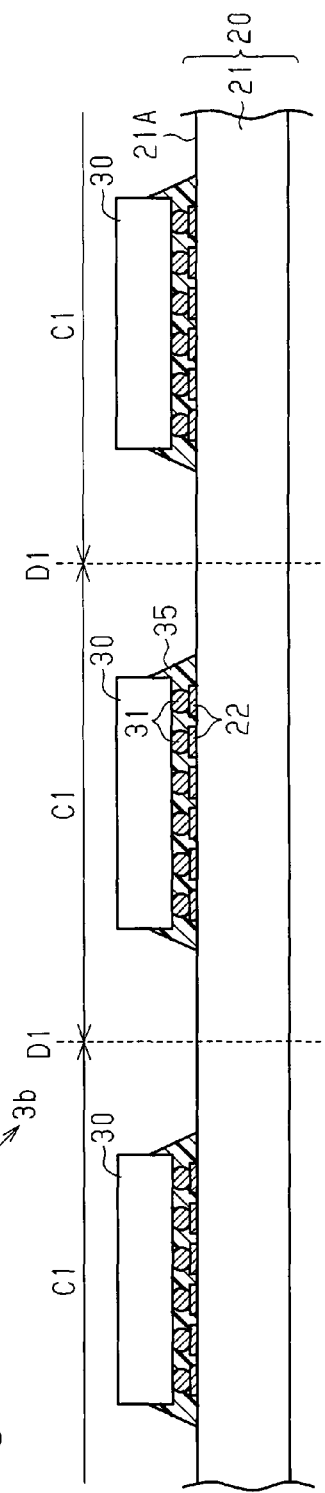
Fig.3A
Fig.3B

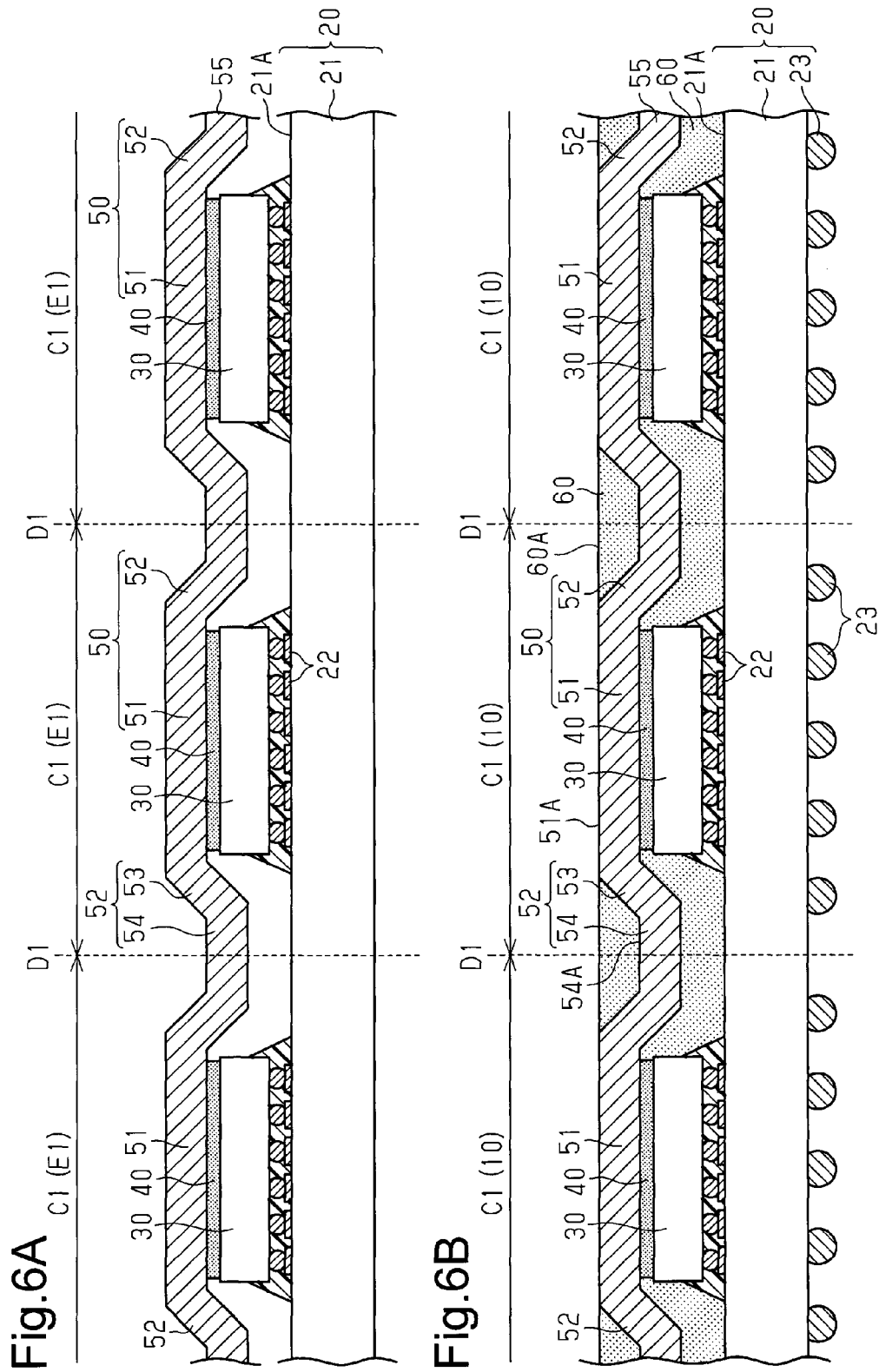

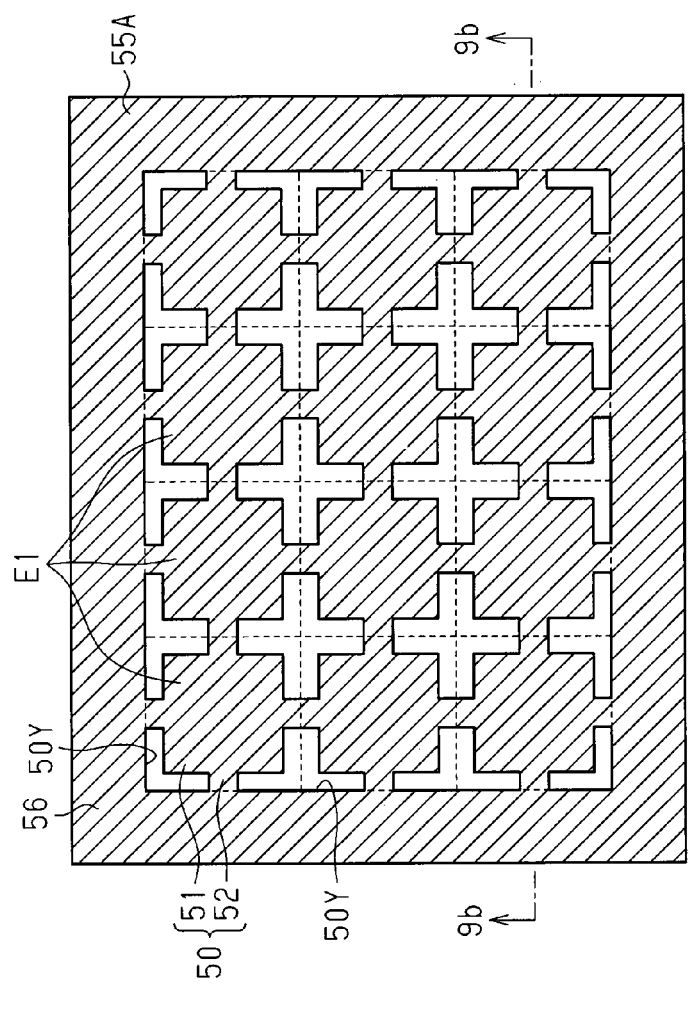
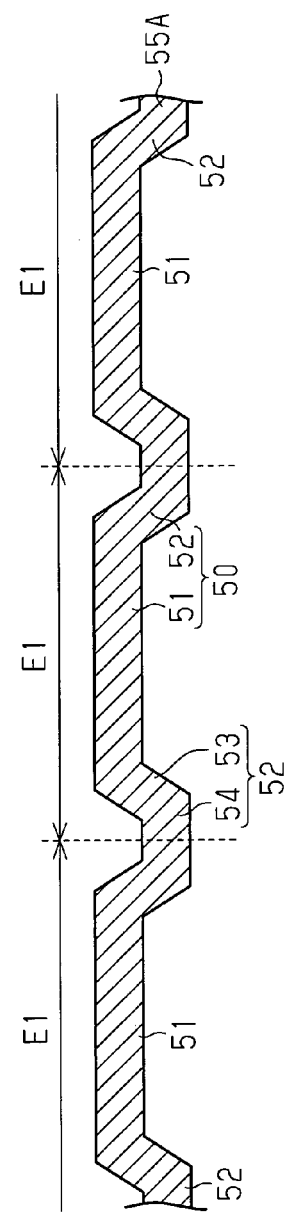
Fig.9A
Fig.9B

HEAT SPREADER WITH WIRING SUBSTRATE FOR REDUCED THICKNESS

CROSS-REFERENCE TO RELATED APPLICATIONS

This application is based upon and claims the benefit of priority from prior Japanese Patent Application No. 2014-227144, filed on Nov. 7, 2014, the entire contents of which are incorporated herein by reference.

FIELD

This disclosure relates to a semiconductor device and a method for manufacturing a semiconductor device.

BACKGROUND

The performance and speed of semiconductor elements used in central processing units (CPUs) and the like have increased. This has increased the amount of heat generated by the semiconductor elements. An increase in the temperature of a semiconductor element may reduce the operation speed of the semiconductor element or cause a failure in the semiconductor element.

To reduce such increases in the temperature of semiconductor elements, various techniques for dissipating heat or cooling semiconductor devices have been proposed. Japanese Laid-Open Patent Publication No. 2009-302556 describes a semiconductor device that includes a heat dissipation plate formed from a metal having a high thermal conductivity. The heat dissipation plate is thermally coupled to a semiconductor element mounted on a wiring substrate by an adhesive. In this structure, when the semiconductor element generates heat, the heat is transmitted to the heat dissipation plate through the adhesive and then to the atmospheric air from the heat dissipation plate. This efficiently dissipates the heat from the semiconductor element and limits increases in the temperature of the semiconductor element.

SUMMARY

In a conventional semiconductor device, a wiring substrate and a heat dissipation plate need to be thick enough to ensure the mechanical strength of the semiconductor device. This inhibits a decrease in the thickness of the entire semiconductor device.

One aspect of this disclosure is a semiconductor device. The semiconductor device includes a wiring substrate, a semiconductor element mounted on the wiring substrate, a heat dissipation plate arranged on an upper surface of the semiconductor element with an adhesive arranged in between, and an encapsulation resin filling a gap between the heat dissipation plate and the wiring substrate. The heat dissipation plate includes a body and a projection. The body is overlapped with the semiconductor element in a plan view and has a larger planar shape than the semiconductor element. The projection is formed integrally with the body. The projection projects outward from an end of the body and is located below the body. The encapsulation resin covers upper and lower surfaces of the projection. The body includes an upper surface exposed from the encapsulation resin.

Other aspects and advantages of the invention will become apparent from the following description, taken in conjunction with the accompanying drawings, illustrating by way of example the principles of the invention.

BRIEF DESCRIPTION OF THE DRAWINGS

The invention is illustrated by way of example and is not limited by the accompanying figures, in which like references indicate similar elements. Elements in the figures are illustrated for simplicity and clarity and have not necessarily been drawn to scale. In the drawings, like numerals are used for like elements throughout.

FIG. 3A is a schematic plan view illustrating a method for manufacturing the semiconductor device of FIG. 1A.

FIG. 3B is a schematic cross-sectional view illustrating the method for manufacturing the semiconductor device of FIG. 1A (cross-sectional view taken along line 3b-3b in FIG. 3A).

FIGS. 6A and 6B are schematic cross-sectional views illustrating the method for manufacturing the semiconductor device of FIG. 1A.

FIG. 9A is a schematic plan view illustrating a method for manufacturing the semiconductor device of FIG. 7A.

FIG. 9B is a schematic cross-sectional view illustrating the method for manufacturing the semiconductor device of FIG. 7A (cross-sectional view taken along line 9b-9b in FIG. 9A).

DESCRIPTION OF THE EMBODIMENTS

Figure 1A:
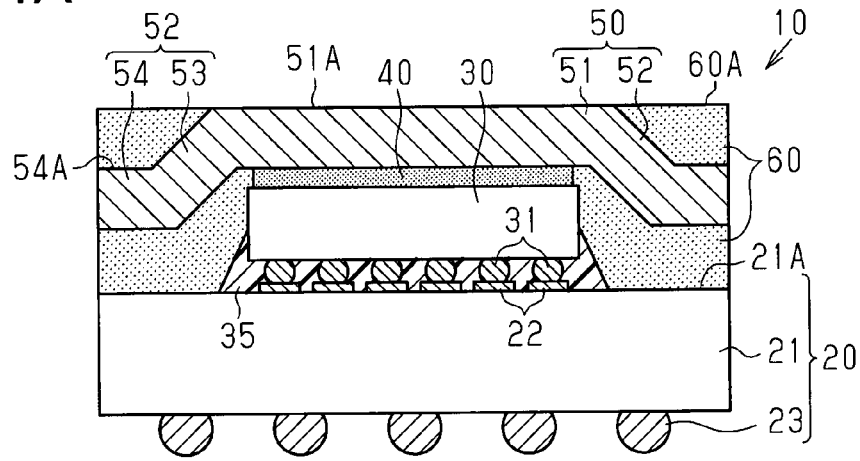
FIG. 1A is a schematic cross-sectional view illustrating a first embodiment of a semiconductor device (cross-sectional view taken along line 1a-1a in FIG. 2).

Embodiments will now be described with reference to the drawings. In the drawings, elements are illustrated for simplicity and clarity and have not necessarily been drawn to scale. To facilitate understanding, hatching lines may not be illustrated or be replaced by shading in the cross-sectional drawings.

First Embodiment

A first embodiment will now be described with reference to FIGS. 1A to 6B.

As illustrated in FIG. 1A, a semiconductor device 10 includes a wiring substrate 20 of a ball grid array (BGA) type, a semiconductor element 30 mounted on an upper surface of the wiring substrate 20, a heat dissipation plate 50 arranged on the semiconductor element 30 with an adhesive 40 located in between, and an encapsulation resin 60 encapsulating the semiconductor element 30 and the like.

The wiring substrate 20 includes a substrate body 21, connection pads 22, and solder balls 23. The substrate body 21 has a substrate internal structure in which the connection pads 22 and the solder balls 23 are electrically connected to each other. For example, the substrate internal structure may or may not include wiring layers. For example, the substrate internal structure includes a plurality of wiring layers, one or more insulation interlayers, which are respectively located between each two adjacent wiring layers, and one or more via wirings, which are formed in each insulation interlayer. In this structure, the wiring layers and the via wirings electrically connect the connection pads 22 and the solder balls 23. When the substrate internal structure does not include wiring layers, for example, through electrodes extend through the substrate body 21 in the thickness-wise direction to electrically connect the connection pads 22 and the solder balls 23. The substrate body 21 may be a build-up core substrate, which has a core substrate, or a coreless substrate, which does not have a core substrate. The thickness of the substrate body 21 may be, for example, approximately 50 to 200 μm.

The connection pads 22 are arranged on an upper surface 21A of the substrate body 21. The material of the connection pads 22 may be, for example, copper (Cu) or an alloy of copper. The solder balls 23 are arranged on a lower surface of the substrate body 21. The material of the solder balls 23 may be, for example, an alloy containing lead (Pb), an alloy of tin (Sn) and Cu, an alloy of Sn and silver (Ag), or an alloy of Sn, Ag, and Cu. For example, the solder balls 23 function as external connection terminals, which are connected to a motherboard or the like.

For example, the semiconductor element 30 includes a semiconductor integrated circuit (not illustrated), which is formed on a thin semiconductor substrate formed from silicon (Si) or the like. In other words, the semiconductor element 30 includes a circuit formation surface (lower surface in FIG. 1A), on which the semiconductor integrated circuit is formed. The circuit formation surface is coated by a passivation film (not illustrated), and connection terminals 31 are arranged on the circuit formation surface.

For example, the semiconductor element 30 may be a logic chip such as a central processing unit (CPU) chip or a graphics processing unit (GPU) chip. Further, the semiconductor element 30 may be, for example, a memory chip such as a dynamic random access memory (DRAM) chip or a flash memory chip. The semiconductor element 30 may have any planar shape and any size. For example, the semiconductor element 30 is rectangular (generally square) in a plan view. The size of the semiconductor element 30 may be, for example, approximately 10 mm×10 mm in a plan view. The thickness of the semiconductor element 30 may be, for example, approximately 10 to 100 μm.

For example, the semiconductor element 30 is flip-chip-mounted on the wiring substrate 20. More specifically, the semiconductor element 30 is electrically connected to the connection pads 22 of the wiring substrate 20 by the connection terminals 31. The connection terminals 31 may be, for example, gold (Au) bumps or solder bumps. The material of the solder bumps may be, for example, an alloy containing Pb, an alloy of Sn and Cu, an alloy of Sn and Ag, or an alloy of Sn, Ag, and Cu.

The gap between the lower surface (circuit formation surface) of the semiconductor element 30 and the upper surface 21A of the substrate body 21 (i.e., upper surface of wiring substrate 20) is filled with an underfill resin 35. The material of the underfill resin 35 may be, for example, an insulative resin such as an epoxy resin.

The adhesive 40 is arranged on a rear surface (upper surface, located at a side opposite to circuit formation surface, in FIG. 1A) of the semiconductor element 30. The adhesive 40 may be, for example, a silicone polymer resin or a thermal conductive member (TIM: Thermal Interface Material). The material of the thermal conductive member may be, for example, indium, which has high thermal conductivity and high electrical conductivity, or the like. Another example of the material of the thermal conductive member is silicone grease containing a material having high electrical conductivity, or an organic resin binder containing metal filler, graphite, or the like. The adhesive 40 is adapted to bond and thermally couple the semiconductor element 30 to the heat dissipation plate 50. The thickness of the adhesive 40 may be, for example, approximately 20 to 30 μm.

The heat dissipation plate 50 is arranged on the rear surface of the semiconductor element 30 with the adhesive 40 located in between. The heat dissipation plate 50 is also referred to as a heat spreader. The heat dissipation plate 50 is adapted to spread the heat generated by the semiconductor element 30 and decrease the concentration of heat. Additionally, the heat dissipation plate 50, which is arranged on the semiconductor element 30, functions to mechanically protect the semiconductor element 30. It is preferred that the material of the heat dissipation plate 50 have sufficient thermal conductivity. The material of the heat dissipation plate 50 may be, for example, Cu, Ag, aluminum (Al), or an alloy of these elements. In the present embodiment, Al is used. Alternatively, the material of the heat dissipation plate 50 may be other than metal if the material has sufficient thermal conductivity.

The heat dissipation plate 50 includes a plate-like body 51 and a plurality (in the present example, four) of projections 52, which are formed integrally with the body 51 and project outward from an end of the body 51. The body 51 includes a lower surface, which is thermally coupled to the rear surface of the semiconductor element 30 by the adhesive 40. Thus, when the semiconductor element 30 generates heat, the heat is transmitted to the heat dissipation plate 50 through the adhesive 40 and then dissipated from the heat dissipation plate 50. The body 51 includes an upper surface 51A, which is exposed from the encapsulation resin 60.

Each projection 52 is located below the body 51. Each projection 52 includes a connection portion 53, which is continuous with the body 51, and an extension 54, which is continuous with the connection portion 53. The connection portion 53 connects the body 51 to the extension 54, which is flat and located below the body 51. For example, each connection portion 53 obliquely projects downward from the end of the body 51 toward a peripheral edge of the substrate body 21 (wiring substrate 20). In other words, each connection portion 53 is bent downward at the end of the body 51. Additionally, for example, each extension 54 extends outward horizontally, that is, in parallel to the body 51, from an end of the corresponding connection portion 53. In other words, each extension 54 is bent at the end of the corresponding connection portion 53 to be generally horizontal. Thus, each extension 54 includes an upper surface 54A and a lower surface, which are parallel to the upper surface 51A of the body 51. In the present example, the lower surface of each extension 54 is located below the lower surface of the body 51 and the rear surface (upper surface, in FIG. 1A) of the semiconductor element 30 and above the circuit formation surface (lower surface, in FIG. 1A) of the semiconductor element 30. Thus, in the heat dissipation plate 50, the body 51, each connection portion 53, and the corresponding extension 54 form a step.

Figure 2:
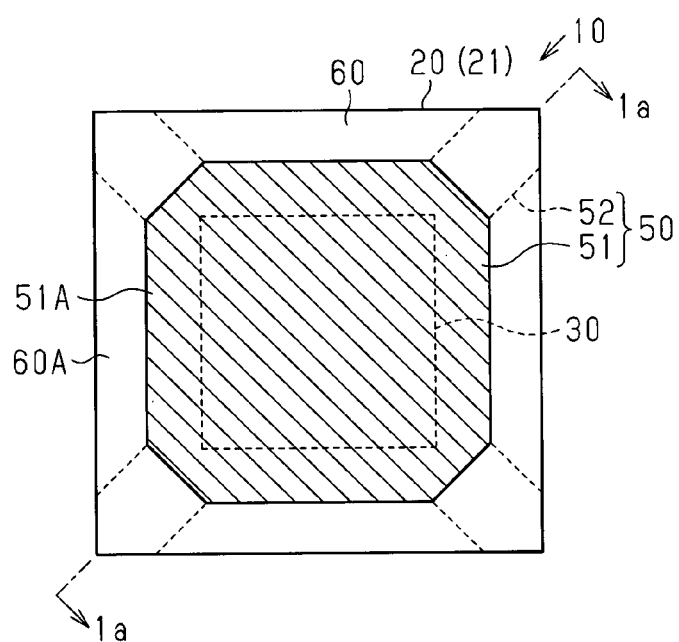
FIG. 2 is a schematic plan view illustrating the semiconductor device of FIG. 1A.

As illustrated in FIG. 2, the body 51 is, for example, rectangular (generally square) in a plan view. In the present example, the four corners of the body 51, which is rectangular in a plan view, are chamfered. In other words, the body 51 of the present example is octagonal in a plan view. The planar shape of the body 51 is slightly smaller than that of the substrate body 21. Additionally, the planar shape of the body 51 is slightly larger than that of the semiconductor element 30. Thus, an exposed surface (upper surface 51A) of the body 51, which is exposed from the encapsulation resin 60, is larger in planar shape than the semiconductor element 30.

Figure 1B:
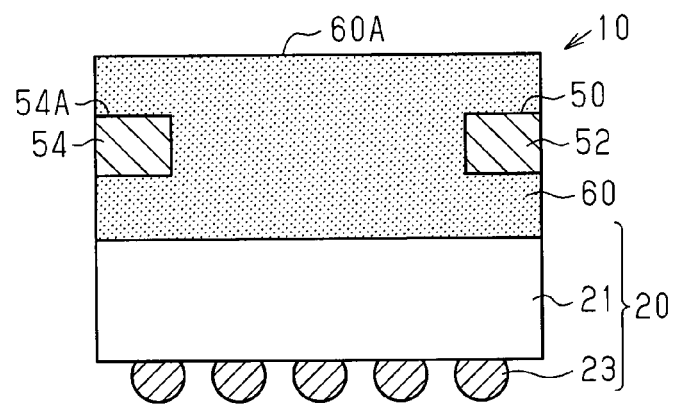
FIG. 1B is a schematic cross-sectional view illustrating the semiconductor device of FIG. 1A.

The projections 52 respectively project from the four chamfered corners of the body 51 toward four corners of the wiring substrate 20. In the present example, in a plan view, the projections 52 extend in directions extending along the diagonal lines of the wiring substrate 20. In this manner, the projections 52 are arranged at locations corresponding to the corners of the body 51. In other words, as illustrated in FIGS. 1B and 2, in a region overlapped with a peripheral region of the wiring substrate 20 in a plan view, only the projections 52 are arranged at locations corresponding to the corners of the wiring substrate 20, and the heat dissipation plate 50 is not arranged at locations corresponding to four sides, excluding the corners, of the wiring substrate 20.

As illustrated in FIG. 1A, the encapsulation resin 60, which encapsulates the semiconductor element 30 and the like, fills a gap between the lower surface of the heat dissipation plate 50 and the upper surface 21A of the substrate body 21. The encapsulation resin 60 also covers an upper surface of each projection 52 (connection portion 53 and extension 54). Thus, the upper and lower surfaces of each projection 52 are covered (encapsulated) by the encapsulation resin 60. The encapsulation resin 60, which is formed in the peripheral region of the substrate body 21, covers side surfaces of the body 51 and side surfaces of projections 52 at locations that are free from the heat dissipation plate 50. The encapsulation resin 60 includes an upper surface 60A that is formed in the peripheral region and, for example, generally flush with the upper surface 51A of the body 51. Additionally, outer side surfaces of the encapsulation resin 60 are generally flush with outer side surfaces of the extensions 54 of the projections 52 and outer side surfaces of the substrate body 21.

In this manner, the encapsulation resin 60 fixes the heat dissipation plate 50 to the wiring substrate 20 and encapsulates the semiconductor element 30. Thus, the encapsulation resin 60 functions as an adhesive, which bonds the heat dissipation plate 50 to the wiring substrate 20, and also as a protection layer, which protects the semiconductor element 30. Further, the encapsulation resin 60 increases the mechanical strength of the entire semiconductor device 10. This allows for a decrease in the thickness of the wiring substrate 20 and the heat dissipation plate 50. Thus, the thickness of the semiconductor device 10 may be entirely decreased.

The material of the encapsulation resin 60 may be, for example, an insulative resin such as an epoxy resin or a polyimide resin. Further, the material of the encapsulation resin 60 may be, for example, a resin material obtained by mixing filler into an epoxy resin or a polyimide resin. The filler may be a known inorganic compound such as silica, an organic compound, or the like. Additionally, the encapsulation resin 60 may be, for example, a mold resin formed by transfer molding, compression molding, injection molding, or the like.

FIG. 1B illustrates one of outer side surfaces of the semiconductor device 10, which is a cross-section of the semiconductor device 10 obtained, for example, by cutting with a dicing blade or the like in a manufacturing process. The outer side surfaces of the semiconductor device 10 expose outer side surfaces of the substrate body 21, outer side surface of the encapsulation resin 60, and outer side surfaces of the extensions 54 of the corresponding projections 52. As described above, the outer side surfaces of the substrate body 21, the outer side surfaces of the encapsulation resin 60, and the outer side surfaces of the extensions 54 are generally flush with one another. Since the upper and lower surfaces of the extensions 54 are covered by the encapsulation resin 60, the extensions 54 are embedded in the encapsulation resin 60. Thus, the outer side surface of each extension 54 is exposed from the encapsulation resin 60 at an intermediate position in the thickness-wise direction of the encapsulation resin 60.

A method for manufacturing the semiconductor device 10 will now be described. For the sake of brevity, portions that ultimately become elements of the semiconductor device 10 are indicated by reference characters used to denote the final elements.

In a step illustrated in FIGS. 3A and 3B, the wiring substrate 20 is prepared. A large substrate is used as the wiring substrate 20 so that a batch of semiconductor devices 10 can be manufactured. For example, the substrate body 21 includes a plurality of separate regions C1 arranged in a matrix (4×3, in FIG. 3A). Each separate region C1 includes a structural body that corresponds to the semiconductor device 10. The large substrate body 21 is ultimately cut into individual semiconductor devices 10 with a dicing blade or the like along the cutting lines D1, which are indicated by broken lines.

Each separate region C1 includes a structural body including the substrate body 21 and the connection pads 22 arranged on the upper surface 21A of the substrate body 21. The structural body may be manufactured using a known manufacturing process. Thus, the manufacturing process will not be described here.

Then, in each separate region C1, the connection terminals 31 of the semiconductor element 30 are flip-chip-joined to the connection pads 22. Then, the underfill resin 35 is formed between the upper surface 21A of the substrate body 21 and the circuit formation surface of the semiconductor element 30.

Figure 4:
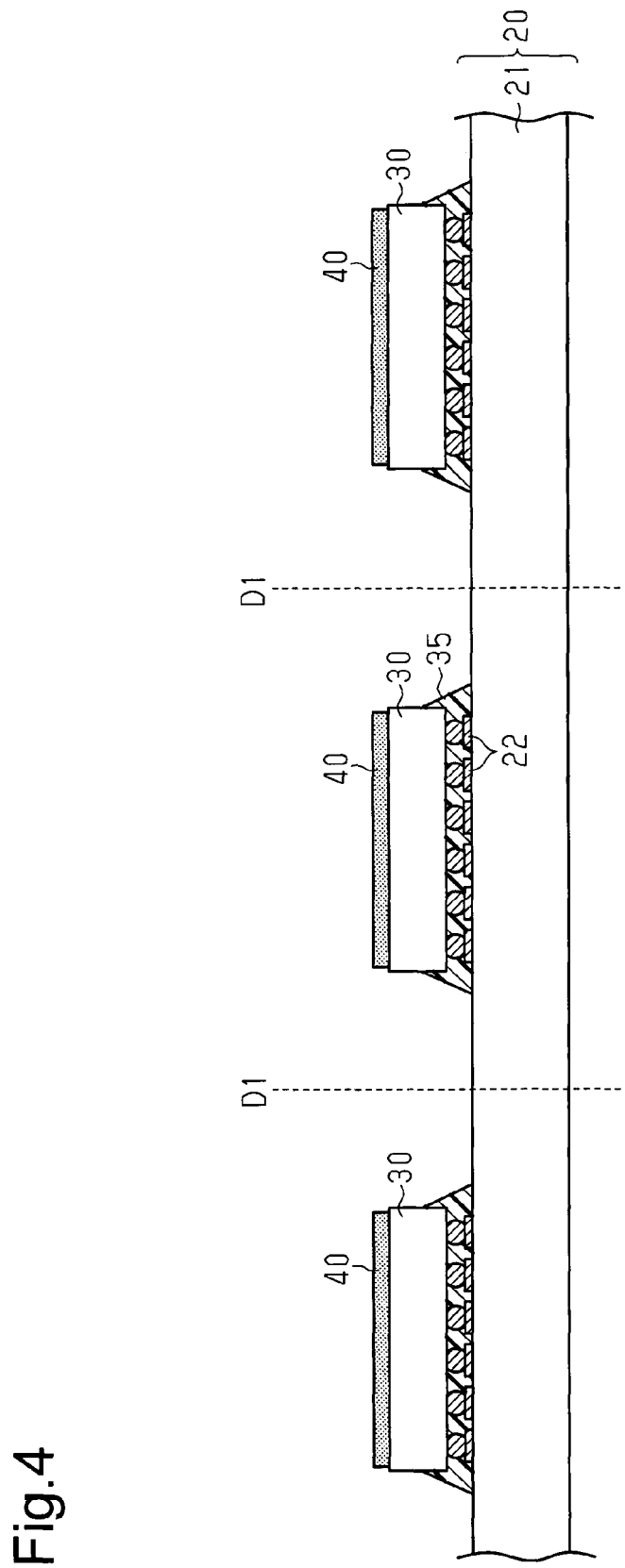
FIG. 4 is a schematic cross-sectional view illustrating the method for manufacturing the semiconductor device of FIG. 1A.

In a step illustrated in FIG. 4, the adhesive 40 is arranged on the rear surface (upper surface, in FIG. 4) of each semiconductor element 30. For example, a thermosetting adhesive 40 is applied to the rear surface of each semiconductor element 30.

Figure 5A:
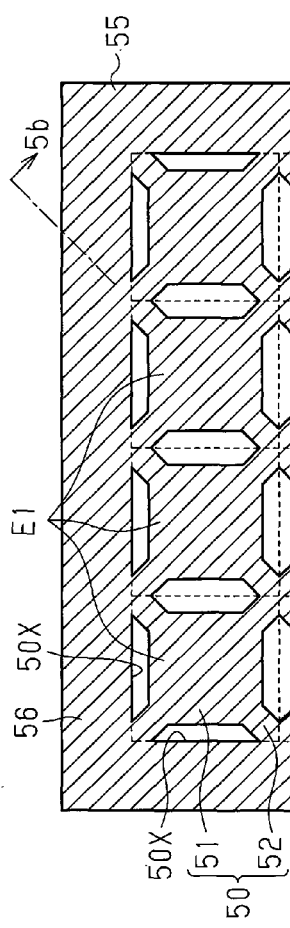
FIG. 5A is a schematic plan view illustrating the method for manufacturing the semiconductor device of FIG. 1A.
Figure 5B:
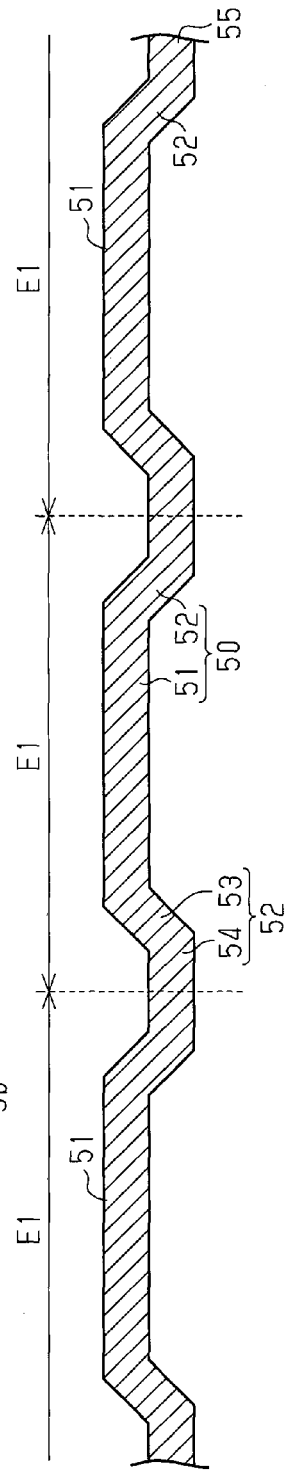
FIG. 5B is a schematic cross-sectional view illustrating the method for manufacturing the semiconductor device of FIG. 1A (cross-sectional view taken along line 5b-5b in FIG. 5A).

As illustrated in FIGS. 5A and 5B, a large heat dissipation plate 55, in which a plurality of heat dissipation plates 50 are joined, is prepared. The heat dissipation plate 55 includes a plurality of separate regions E1 and a frame 56, which surrounds the separate regions E1. The separate regions E1 are arranged in a matrix (4×3, in FIG. 5A) at locations corresponding to the separate regions C1 of the substrate body 21.

Each separate region E1 includes the heat dissipation plate 50. More specifically, in each separate region E1, the heat dissipation plate 50 includes a body 51 in the generally center of the separate region E1 and four projections 52. The four projections 52 respectively project from four corners of the body 51 toward four corners of the separate region E1. In other words, each separate' region E1 includes four openings 50X, which define the body 51 and the projections 52. Two openings 50X, which are located between adjacent separate regions E1, are continuous with each other to form a single integrated opening. Each integrated opening (two continuous openings 50X) separates the bodies 51 of adjacent heat dissipation plates 50 from each other. Additionally, due to the openings 50X, the peripheral region of each separate region E1, including a boundary between separate regions E1 (refer to broken lines), includes only the projections 52 of the heat dissipation plate 50.

Each projection 52 of each heat dissipation plate 50 is joined to at least one of a projection 52 of an adjacent heat dissipation plate 50 and the frame 56. More specifically, two adjacent heat dissipation plates 50 are joined to each other by the projections 52 of the two heat dissipation plates 50. Also, each heat dissipation plate 50 that is adjacent to the frame 56 is joined to the frame 56 by the projections 52 of the heat dissipation plate 50. In this manner, when a plurality of heat dissipation plates 50 is supported by the frame 56, a plurality of bodies 51 is supported by the frame 56 and the projections 52. Thus, in the heat dissipation plate 55, the projections 52 function as suspenders, which support the bodies 51. The projections 52 are, for example, processed so that the projections 52 and the bodies 51 form the steps (refer to FIG. 5B). As described above, each projection 52 includes the connection portion 53, obliquely extending downward from the end of the body 51, and the extension 54, arranged generally parallel to the body 51. The large heat dissipation plate 55, which has been described, is manufactured, for example, through a stamping process, a forging process, a machining process, or the like. For example, a metal plate is punched out and then pressed to manufacture the heat dissipation plate 55.

In a step illustrated in FIG. 6A, the heat dissipation plate 55 is placed on the wiring substrate 20. More specifically, the heat dissipation plate 55 is placed on the wiring substrate 20 so that the 4×3 separate regions C1 of the wiring substrate 20 are vertically aligned with the 4×3 separate regions E1 of the heat dissipation plate 55. More specifically, the heat dissipation plate 55 is placed on the semiconductor elements 30 so that the lower surface of the body 51 of each heat dissipation plate 50 is opposed to the rear surface of the corresponding semiconductor element 30 and each extension 54 is opposed to the upper surface 21A of the substrate body 21 in the boundary (i.e., cutting lines D1) of the separate region C1. In this case, only the extensions 54 are located on the cutting lines D1.

Then, the heat dissipation plate 55 is bonded to the rear surface of each semiconductor element 30 with the adhesive 40. For example, heat and pressure is applied to the wiring substrate 20, the adhesive 40, and the heat dissipation plates 50 to cure the adhesive 40 while the lower surface of the body 51 of each heat dissipation plate 50 abuts on the adhesive 40. Thus, the heat dissipation plate 55 (heat dissipation plates 50) is joined to the semiconductor elements 30 by the adhesive 40. As described above, the heat dissipation plate 55, illustrated in FIG. 5B, is stacked on the structural body, illustrated in FIG. 4, to obtain an integrated structural body. The integrated structural body is placed between two press heating plates, and heat and pressure is applied to the integrated structural body using a vacuum press or the like. Consequently, the structural body illustrated in FIG. 6A may be obtained.

In the present embodiment, the large heat dissipation plate 55, which includes a plurality (here, twelve) of heat dissipation plates 50, is simultaneously bonded to a plurality of semiconductor elements 30. This reduces steps for bonding a plurality of heat dissipation plates 50 compared to when the heat dissipation plates 50 are individually bonded to the semiconductor elements 30.

In a step illustrated in FIG. 6B, the encapsulation resin 60 is formed to fill the openings 50X (refer to FIG. 5A) of the heat dissipation plate 55 and the gap between the wiring substrate 20 and the heat dissipation plate 55. The encapsulation resin 60 covers the side surfaces of each body 51 and the upper and lower surfaces of each projection 52, which is located below the body 51. The upper surface 60A of the encapsulation resin 60, which is formed in the peripheral region of each separate region C1, is generally flush with the upper surface 51A of the body 51. The encapsulation resin 60 firmly fixes the wiring substrate 20 and the heat dissipation plate 50 and encapsulates the semiconductor element 30.

For example, when a thermosetting mold resin is used as the material of the encapsulation resin 60, the structural body illustrated in FIG. 6A is accommodated in a mold, and a fluid mold resin is drawn into the mold when applied with pressure (e.g., 5 to 10 MPa). Subsequently, the mold resin is heated and cured at a temperature of approximately 180° C. to form the encapsulation resin 60. Examples of a process for filling the mold resin include transfer molding, compression molding, injection molding, or the like.

Then, the solder balls 23 are arranged on the lower surface of the substrate body 21 in each separate region C1. Through the above manufacturing steps, a structural body that corresponds to the semiconductor device 10 may be manufactured in each separate region C1.

Subsequently, the structural body illustrated in FIG. 6B is cut along the cutting lines D1 with a dicing blade or the like. More specifically, the substrate body 21, the encapsulation resin 60, and the extensions 54 of the projections 52 are cut along the cutting lines D1. Consequently, a plurality of semiconductor devices 10 is manufactured. Subsequent to the singulation, each semiconductor device 10 includes cut surfaces, which expose outer side surfaces of the substrate body 21, outer side surfaces of the encapsulation resin 60, and outer side surfaces of the extensions 54.

In the cutting process, for example, cutting is performed from the side of the lower surface of the substrate body 21 along the cutting lines D1 with a dicing blade or the like. In this case, in the structural body illustrated in FIG. 6B, the upper surfaces 54A (and lower surfaces) of the extensions 54 of the heat dissipation plates 50 (projections 52) are covered by the encapsulation resin 60 at the locations of the cutting lines D1 (cutting region). Thus, at the locations of the cutting lines D1, the metal heat dissipation plates 50 (extensions 54) are not exposed in an upper surface of the structural body of FIG. 6B. This limits the formation of burrs (here, a metal burr) on cut surfaces even when cutting from the side of the lower surface of the substrate body 21 with a dicing blade.

The first embodiment has the advantages described below.

(1) The semiconductor element 30 is flip-chip-mounted on the wiring substrate 20. The heat dissipation plate 50 is bonded to the rear surface of the semiconductor element 30 with the adhesive 40. The encapsulation resin 60 fills the gap between the heat dissipation plate 50 and the wiring substrate 20. The encapsulation resin 60 increases the mechanical strength of the entire semiconductor device 10. This effectively reduces warpage of the semiconductor device 10. This also allows for a decrease in the thickness of the wiring substrate 20 and the heat dissipation plate 50. Thus, the thickness of the semiconductor device 10 may be entirely decreased.

(2) The encapsulation resin 60 covers the upper and lower surfaces of each projection 52, which is a portion of the heat dissipation plate 50. Thus, the projection 52 is embedded in the encapsulation resin 60. This favorably inhibits separation of the heat dissipation plate 50 from the semiconductor element 30.

(3) The peripheral shape (planar shape) of the body 51 is larger than that of the semiconductor element 30. The upper surface 51A of the body 51 is exposed from the encapsulation resin 60. Thus, the heat, which is generated by the semiconductor element 30, may be efficiently dissipated from the heat dissipation plate 50 (body 51) to the atmospheric air. This improves the heat dissipation properties of the semiconductor device 10.

(4) When singulating the large wiring substrate 20 into a plurality of semiconductor devices 10, if the heat dissipation plate 50 is exposed on the cutting lines D1, a burr would be formed on cut surfaces of the heat dissipation plate 50. For example, if the structural body of FIG. 6A prior to the formation of the encapsulation resin 60 is cut along the cutting lines D1, a burr would be formed on cut surfaces of the heat dissipation plate 50. Additionally, even after the encapsulation resin 60 is formed, if the upper surface of the heat dissipation plate 50 is exposed from the encapsulation resin 60 on the cutting lines D1, a burr would be formed on cut surfaces of the heat dissipation plate 50.

However, in the present embodiment, after the encapsulation resin 60 is formed to cover the upper and lower surfaces of each projection 52 of the heat dissipation plate 50 at the locations of the cutting lines D1, the encapsulation resin 60, the projections 52, and the like are cut along the cutting lines D1. That is, when the projections 52 are not exposed at the locations of the cutting lines D1, the encapsulation resin 60, the projections 52, and the like are cut along the cutting lines D1. This limits the formation of burrs on the cut surfaces.

(5) The large heat dissipation plate 55, including a plurality of heat dissipation plates 50, includes the openings 50X between adjacent heat dissipation plates 50. Thus, the adjacent heat dissipation plates 50 are joined by the projections 52, which project from only portions (corners) of the periphery of the body 51. This decreases the region of projections 52 that is located on the cutting lines D1 as compared to when the projections 52 are arranged on the entire periphery of the body 51. Thus, when singulating into a plurality of individual semiconductor devices 10, the cut amount of the projections 52 (heat dissipation plate 50) may be decreased. As a result, the manufacturing time may be shortened, which contributes to a reduction in the manufacturing cost. Further, damage to a dicing blade may be decreased when cutting.

(6) A plurality (in the present example, twelve) of heat dissipation plates 50, which are joined to one another in the large heat dissipation plate 55, are simultaneously bonded to a plurality of semiconductor elements 30. This reduces steps for bonding a plurality of heat dissipation plates 50 as compared to when the heat dissipation plates 50 are cut and then individually bonded to the semiconductor elements 30. As a result, the manufacturing time may be shortened, which contributes to a reduction in the manufacturing cost.

Second Embodiment

A second embodiment will now be described with reference to FIGS. 7A to 9B. The second embodiment differs from the first embodiment in the position of the projections 52 relative to the body 51. Here, the description will focus on the differences from the first embodiment. The same reference characters are given to those components that are the same as the corresponding components illustrated in FIGS. 1A to 6B. Such components will not be described in detail.

Figure 8:
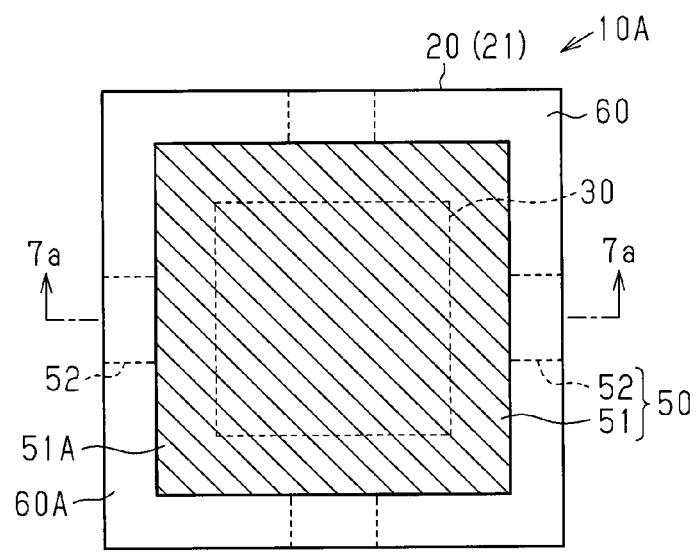
FIG. 8 is a schematic plan view illustrating the semiconductor device of FIG. 7A.

FIG. 8 illustrates a semiconductor device 10A of the second embodiment. A heat dissipation plate 50 includes a body 51, which is, for example, rectangular (generally square) in a plan view. The planar shape of the body 51 is slightly smaller than that of a substrate body 21 and slightly larger than that of a semiconductor element 30.

Projections 52 project outward from any single location of each side of the body 51. In the present example, each projection 52 projects outward from a generally middle portion of the corresponding side of the body 51. Thus, as illustrated in FIGS. 7B and 8, in a region overlapped with a peripheral region of a wiring substrate 20 in a plan view, only the projections 52 are arranged at locations corresponding to the generally middle portions of the sides of the wiring substrate 20, and the heat dissipation plate 50 is not arranged at any other locations.

Figure 7A:
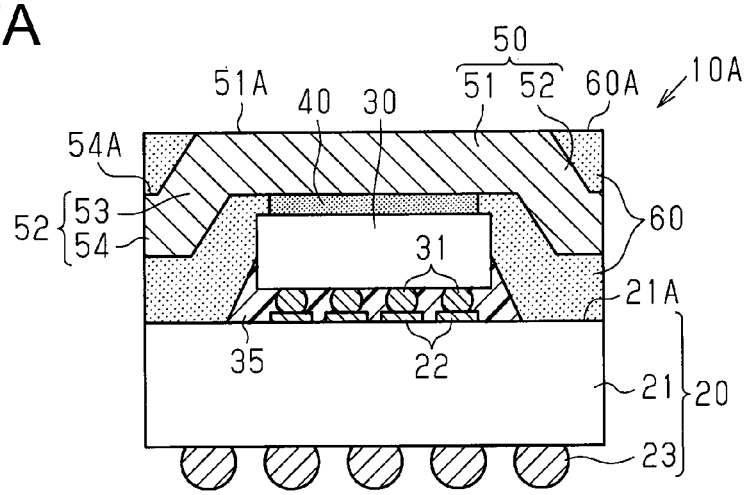
FIG. 7A is a schematic cross-sectional view illustrating a second embodiment of a semiconductor device (cross-sectional view taken along line 7a-7a in FIG. 8).

As illustrated in FIG. 7A, in the same manner as the first embodiment, each projection 52 includes a connection portion 53, which obliquely projects downward from an end (generally middle portion of corresponding side) of the body 51, and an extension 54, which extends outward horizontally from an end of the connection portion 53. Each projection 52 includes upper and lower surfaces, which are covered by an encapsulation resin 60.

Figure 7B:
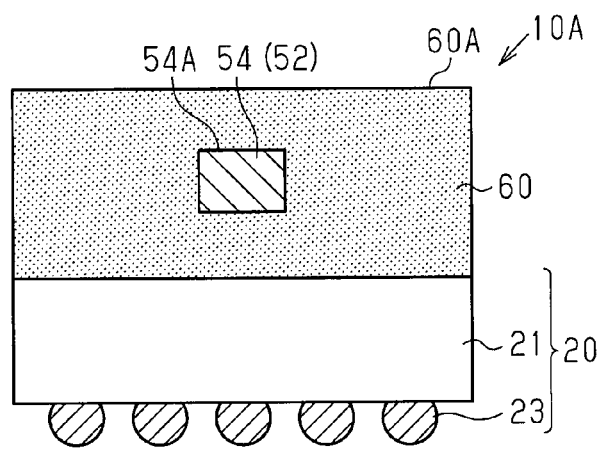
FIG. 7B is a schematic side view illustrating the semiconductor device of FIG. 7A.

FIG. 7B illustrates one of outer side surfaces of the semiconductor device 10A, which is a cross-section of the semiconductor device 10 obtained, for example, by cutting with a dicing blade or the like in a manufacturing process. The outer side surfaces of the semiconductor device 10A expose outer side surfaces of the substrate body 21, outer side surfaces of the encapsulation resin 60, and outer side surfaces of the extensions 54 of the corresponding projection 52. The outer side surfaces of the substrate body 21, the outer side surfaces of the encapsulation resin 60, and the outer side surfaces of the extensions 54 are generally flush with one another. The extension 54 is embedded in the encapsulation resin 60 at an intermediate position in the thickness-wise direction of the encapsulation resin 60. Thus, the outer side surface of each extension 54 is exposed from the encapsulation resin 60 at a generally center position in the width-wise direction (left-right direction, in FIG. 7B) of the corresponding outer side surface of the encapsulation resin 60.

The semiconductor device 10A, which has been described, may be manufactured through the same method for manufacturing the semiconductor device 10 of the first embodiment. However, a large heat dissipation plate 55A, which is used in the manufacturing process, differs in structure. Thus, the heat dissipation plate 55A will now be described. Here, the description will focus on the differences from the heat dissipation plate 55 of the first embodiment.

As illustrated in FIG. 9A, in each separate region E1, the heat dissipation plate 55A includes a body 51 in the generally center of the separate region E1 and four projections 52. Each projection 52 projects from a middle portion of one of four corners of the body 51 toward the peripheral edge of the separate region E1. In other words, each separate region E1 includes four openings 50Y, which define the body 51 and the projections 52. Two openings 50Y, which are located between adjacent separate regions E1, are continuous with each other to form a single integrated opening. Each integrated opening (two continuous openings 50Y) separates the bodies 51 of adjacent heat dissipation plates 50 from each other. Additionally, due to the openings 50Y, the peripheral region of each separate region E1, including a boundary between separate regions E1 (refer to broken lines), includes only the projections 52 of the heat dissipation plate 50.

Two adjacent heat dissipation plates 50 are joined to each other by the projections 52 of the two heat dissipation plates 50. Also, each heat dissipation plate 50 that is adjacent to the frame 56 is joined to the frame 56 by at least one projection 52 of the heat dissipation plate 50. In this manner, in the heat dissipation plate 55A of the present example, four projections 52 extend from each heat dissipation plate 50 in the left-right direction and the vertical direction of FIG. 9A. Thus, a plurality of heat dissipation plates 50 (bodies 51) is coupled together. The projections 52 are, for example, machined so that the projections 52 and the bodies 51 form steps (refer to FIG. 9B). The large heat dissipation plate 55A, which has been described, is manufactured, for example, through a stamping process, a forging process, a machining process, or the like.

In the step illustrated in FIG. 6A, the heat dissipation plate 55A is used instead of the heat dissipation plate 55. More specifically, the heat dissipation plate 55A is bonded to the rear surfaces of the semiconductor elements 30 with an adhesive 40. Subsequently, the step illustrated in FIG. 6B and the cutting process are performed to manufacture the semiconductor device 10A of the second embodiment.

The second embodiment has the same advantages as the first embodiment.

It should be apparent to those skilled in the art that the present invention may be embodied in many other specific forms without departing from the scope of the invention. Particularly, it should be understood that the present invention may be embodied in the following forms.

Figure 10:
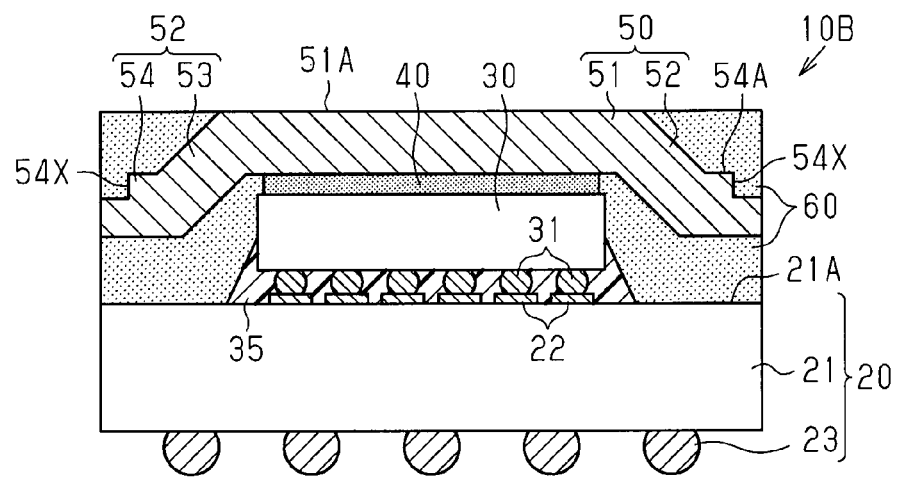
FIGS. 10 and 11 are schematic cross-sectional views illustrating various modified examples of a semiconductor device.

FIG. 10 illustrates a first modified example of a semiconductor device 10B. As illustrated in FIG. 10, the upper surface 54A of each extension 54 may include a cutaway portion 54X. For example, each extension 54 includes a first end, which is connected to the connection portion 53, and a second end, which is located at a side opposite to the first end. The cutaway portion 54X is formed in the upper surface 54A of the second end of the extension 54. In the semiconductor device 10B, the outer side surface of each extension 54, which is exposed from the corresponding outer side surface of the encapsulation resin 60, is decreased in area as compared to when the extension 54 includes no cutaway portion 54X. That is, a portion of each extension 54 that is cut when cutting into individual semiconductor devices 10B is reduced in thickness by the cutaway portion 54X. This allows for a decrease in the cut amount of the extensions 54 (heat dissipation plates 50) during a singulation process. The cutaway portions 54X are formed, for example, when the extensions 54 are partially thinned by a pressing process. Although FIG. 10 illustrates the first modified example as a modified example of the first embodiment, the first modified example may be a modified example of the second embodiment.

In the first modified example of FIG. 10, the cutaway portions 54X are formed in the upper surfaces of the second ends of the extensions 54. However, the cutaway portions 54X may be formed in lower surfaces of the second ends of the extensions 54.

Alternatively, instead of the cutaway portions 54X, each of the heat dissipation plates 55, 55A may include through holes extending through the extensions 54 in the width-wise direction at intermediate locations in the thickness-wise direction of the extensions 54 that are located in the boundary between separate regions E1. This also allows for a decrease in the cut amount of the extensions 54 when singulating into individual semiconductor devices 10.

Figure 11:
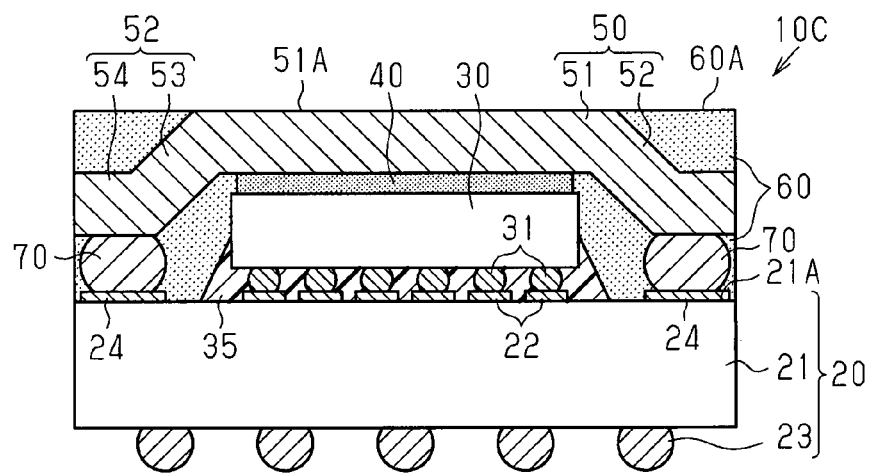

FIG. 11 illustrates a second modified example of a semiconductor device 10C. As illustrated in FIG. 11, the projections 52 (here, extensions 54) of the heat dissipation plate 50 may be bonded to ground wirings 24, which are formed on the upper surface 21A of the substrate body 21, with an adhesive 70. The adhesive 70 is electrically conductive. For example, an Ag paste may be used as the adhesive 70. The adhesive 70 electrically connects the heat dissipation plate 50 to the ground wirings 24. In the present modified example, an electrically conducive material such as Cu, Ag, Al, an alloy of these elements, or the like is used as the material of the heat dissipation plate 50.

The ground wirings 24 are set to the ground potential. Thus, the heat dissipation plate 50, which is electrically connected to the ground wirings 24, is set to the ground potential. The ground wirings 24 are formed in the periphery region of the substrate body 21 and exposed from the underfill resin 35.

In the semiconductor device 10C, the heat dissipation plate 50 may function as a shield layer that protects the semiconductor element 30 from electromagnetic waves and the like.

In each of the semiconductor devices 10, 10A, 10B of the first embodiment, the second embodiment, and the first modified example, the ground wirings 24 may be formed on the upper surface 21A of the substrate body 21 in the same manner as FIG. 11. Also, the encapsulation resin 60 may be changed to an encapsulation resin formed from an electrically conductive material. In this case, the heat dissipation plate 50 is electrically connected to the ground wirings 24 by the electrically conductive encapsulation resin.

Alternatively, subsequent to the singulation into the semiconductor devices 10, 10A, 10B, metal patterns may be formed so that the metal patterns electrically connect the heat dissipation plate 50 to the ground wirings formed on the wiring substrate 20. For example, connection wirings may be formed on outer side surfaces of the semiconductor devices 10, 10A, 10B subsequent to the singulation so that the connection wirings connect the outer side surfaces of the heat dissipation plate 50 (extensions 54), which is exposed from the encapsulation resin 60, to the ground wirings, which are exposed from the substrate body 21.

In each of the above embodiments and modified examples, the connection portions 53 of the heat dissipation plate 50 may extend vertically downward from the end of the body 51.

In the method for manufacturing each of the above embodiments, the large wiring substrate 20 includes a plurality of separate regions C1 that is arranged in a matrix. Instead, for example, a large wiring substrate may include a plurality of separate regions C1 that is laid out in a strip-shaped arrangement. That is, the layout of the separate regions C1 is not particularly limited as long as a large wiring substrate includes the separate regions C1 that are laid out in an N×M arrangement (N is an integer greater than or equal to two, M is an integer greater than or equal to one).

In the above embodiments, the large heat dissipation plates 55, 55A each include a plurality of heat dissipation plates 50 (separate regions E1) that is arranged in a matrix. Instead, for example, a large heat dissipation plate may include a plurality of heat dissipation plates 50 (separate regions E1) that are laid out in a strip-shaped arrangement. That is, the layout of the heat dissipation plates 50 (separate regions E1) is not particularly limited as long as an N×M number of heat dissipation plates 50 is arranged in a large heat dissipation plate.

In each of the above embodiments and modified examples, the number of semiconductor elements 30 that are mounted on the wiring substrate 20 of each semiconductor device 10 is not particularly limited. For example, two or more semiconductor elements 30 may be mounted on the wiring substrate 20 of each semiconductor device 10.

Electronic components other than the semiconductor element 30 may be mounted on the wiring substrate 20 of each semiconductor device 10.

Each of the above embodiments and modified examples uses the wiring substrate 20 of a BGA type. However, a wiring substrate of a pin grid array (PGA) type or a land grid array (LGA) type may be used.

In each of the above embodiments and modified examples, various cooling means and heat dissipation means such as a heat, dissipation fin, a heat pipe, a vapor chamber, and the like may be arranged above the heat dissipation plate 50.

Clauses

This disclosure further encompasses the following embodiment.

1. A method for manufacturing a semiconductor device, the method including:
preparing a wiring substrate that includes an N×M number of separate regions, where N is an integer greater than or equal to two, and M is an integer greater than or equal to one;
mounting a semiconductor element on an upper surface of the wiring substrate in each separate region;
preparing a large heat dissipation plate that includes an N×M number of heat dissipation plates, which are joined together, wherein each heat dissipation plate includes a body and a projection, which is formed integrally with the body, and the projection projects outward from an end of the body so that the projection and the body form a step;
bonding the large heat dissipation plate on an upper surface of the semiconductor element with an adhesive arranged in between so that the body is overlapped with the semiconductor element in a plan view;
filling a gap between the large heat dissipation plate and the wiring substrate with an encapsulation resin, wherein the encapsulation resin covers upper and lower surfaces of the projection and exposes an upper surface of the body; and
cutting the encapsulation resin, the projection, and the wiring substrate in a cutting region to singulate a plurality of individual semiconductor devices, wherein the cutting region is set at an outer side of the body in each separate region.

2. The method according to clause 1, wherein the projection projects outward from one of a plurality of corners of the body or from a portion of one of a plurality of sides of the body.

The present examples and embodiments are to be considered as illustrative and not restrictive, and the invention is not to be limited to the details given herein, but may be modified within the scope and equivalence of the appended claims.

The invention claimed is:

1. A semiconductor device comprising:
a wiring substrate;
a semiconductor element mounted on the wiring substrate;
a heat dissipation plate arranged on an upper surface of the semiconductor element with an adhesive arranged in between; and
an encapsulation resin that fills a gap between the heat dissipation plate and the wiring substrate; wherein
the heat dissipation plate includes:
a body overlapped with the semiconductor element in a plan view, wherein the body has a larger planar shape than the semiconductor element; and
a projection formed integrally with the body,
wherein the projection projects outward from an end of the body and is located below the body,
the encapsulation resin covers upper and lower surfaces of the projection,
the body includes an upper surface exposed from the encapsulation resin;
the projection includes:
a connection portion that extends downward from the end of the body; and
an extension that extends outward from an end of the connection portion in parallel to the body;
the extension includes a first end, which is connected to the connection portion, and a second end, which is located at a side opposite to the first end, wherein the second end includes an outer side surface of the extension exposed from an outer side surface of the encapsulation resin, and
the second end of the extension includes a cutaway portion to decrease an area of the outer side surface of the extension exposed from the outer side surface of the encapsulation resin,
wherein the cutaway portion is cut in the outer side surface of the extension so that a thickness of the second end is smaller than a thickness of the first end.

2. The semiconductor device according to claim 1, wherein the projection projects outward from one of a plurality of corners of the body or from a portion of one of a plurality of sides of the body.

3. The semiconductor device according to claim 1, wherein
the extension, the encapsulation resin, and the wiring substrate each include an outer side surface, and
the outer side surface of the extension is flush with the outer side surface of the encapsulation resin and the outer side surface of the wiring substrate.

4. The semiconductor device according to claim 1, wherein the projection is electrically connected to a ground wiring, which is formed on an upper surface of the wiring substrate, by an electrically conductive adhesive.

5. The semiconductor device according to claim 1, wherein the encapsulation resin covers entire upper and entire lower surfaces of the projection.

6. The semiconductor device according to claim 1, wherein the outer side surface of the extension is coplanar with the outer side surface of the encapsulation resin.

* * * * *